United States Patent
Werber et al.

(10) Patent No.: US 9,209,109 B2
(45) Date of Patent: Dec. 8, 2015

(54) IGBT WITH EMITTER ELECTRODE ELECTRICALLY CONNECTED WITH AN IMPURITY ZONE

(71) Applicant: Infineon Technoloiges AG, Neubiberg (DE)

(72) Inventors: Dorothea Werber, Munich (DE); Thomas Gutt, Taufkirchen (DE); Mathias Plappert, Villach (AT); Frank Pfirsch, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/941,829

(22) Filed: Jul. 15, 2013

(65) Prior Publication Data

US 2015/0014743 A1 Jan. 15, 2015

(51) Int. Cl.
   - H01L 29/66  (2006.01)
   - H01L 23/48  (2006.01)
   - H01L 29/417 (2006.01)
   - H01L 29/423 (2006.01)
   - H01L 29/739 (2006.01)
   - H01L 29/06  (2006.01)
   - H01L 29/08  (2006.01)

(52) U.S. Cl.
   CPC ............ *H01L 23/48* (2013.01); *H01L 29/0696* (2013.01); *H01L 29/0834* (2013.01); *H01L 29/41708* (2013.01); *H01L 29/4236* (2013.01); *H01L 29/7397* (2013.01)

(58) Field of Classification Search
   CPC ................. H01L 29/66712; H01L 29/66681; H01L 29/41708; H01L 29/7393; H01L 23/48
   USPC ........................... 438/204, 203, 202; 257/140
   See application file for complete search history.

(56) References Cited

U.S. PATENT DOCUMENTS

| | | | |
|---|---|---|---|
| 5,475,257 A * | 12/1995 | Hashimoto et al. | ........... 257/587 |
| 7,535,283 B2 | 5/2009 | Kojima | |
| 8,203,366 B2 | 6/2012 | Lee | |
| 8,384,151 B2 | 2/2013 | Pfirsch | |

(Continued)

FOREIGN PATENT DOCUMENTS

| DE | 102006049354 B3 | 6/2008 |
|---|---|---|
| EP | 0269095 B1 | 2/1994 |

OTHER PUBLICATIONS

Pfirsch, et al. "Reverse Conducting IGBT." U.S. Appl. No. 13/529,166, filed Jun. 21, 2012.

(Continued)

*Primary Examiner* — Caridad Everhart
(74) *Attorney, Agent, or Firm* — Murphy, Bilak & Homiller, PLLC

(57) ABSTRACT

An IGBT includes a semiconductor portion with IGBT cells. Each IGBT cell includes a source zone of a first conductivity type, a body zone of a second, complementary conductivity type, and a drift zone of the first conductivity type separated from the source zone by the body zone. An emitter electrode includes a main layer and an interface layer. The interface layer directly adjoins at least one of the body zone and a supplementary zone of the second conductivity type. A contact resistance between the semiconductor portion and the interface layer is higher than between the semiconductor portion and a material of the main layer. For example, the interface layer may reduce diode emitter efficiency and reverse recovery losses in IGBTs.

23 Claims, 10 Drawing Sheets

(56) References Cited

U.S. PATENT DOCUMENTS

| | | |
|---|---|---|
| 2004/0027762 A1 | 2/2004 | Ohi et al. |
| 2008/0030257 A1 | 2/2008 | Jasberg et al. |
| 2008/0122497 A1 | 5/2008 | Ishikawa et al. |
| 2009/0085103 A1 | 4/2009 | Hille et al. |
| 2010/0123189 A1* | 5/2010 | Venkatraman et al. ....... 257/330 |
| 2012/0099234 A1 | 4/2012 | Inoue et al. |
| 2012/0299624 A1 | 11/2012 | Sugahara et al. |
| 2013/0063188 A1 | 3/2013 | Sogo et al. |
| 2013/0082301 A1* | 4/2013 | Onozawa et al. ............. 257/139 |
| 2013/0278298 A1 | 10/2013 | Curbelo et al. |
| 2013/0314834 A1 | 11/2013 | Tamaki et al. |

OTHER PUBLICATIONS

Werber, et al. "Reverse Conducting IGBT." U.S. Appl. No. 13/529,185, filed Jun. 21, 2012.

* cited by examiner

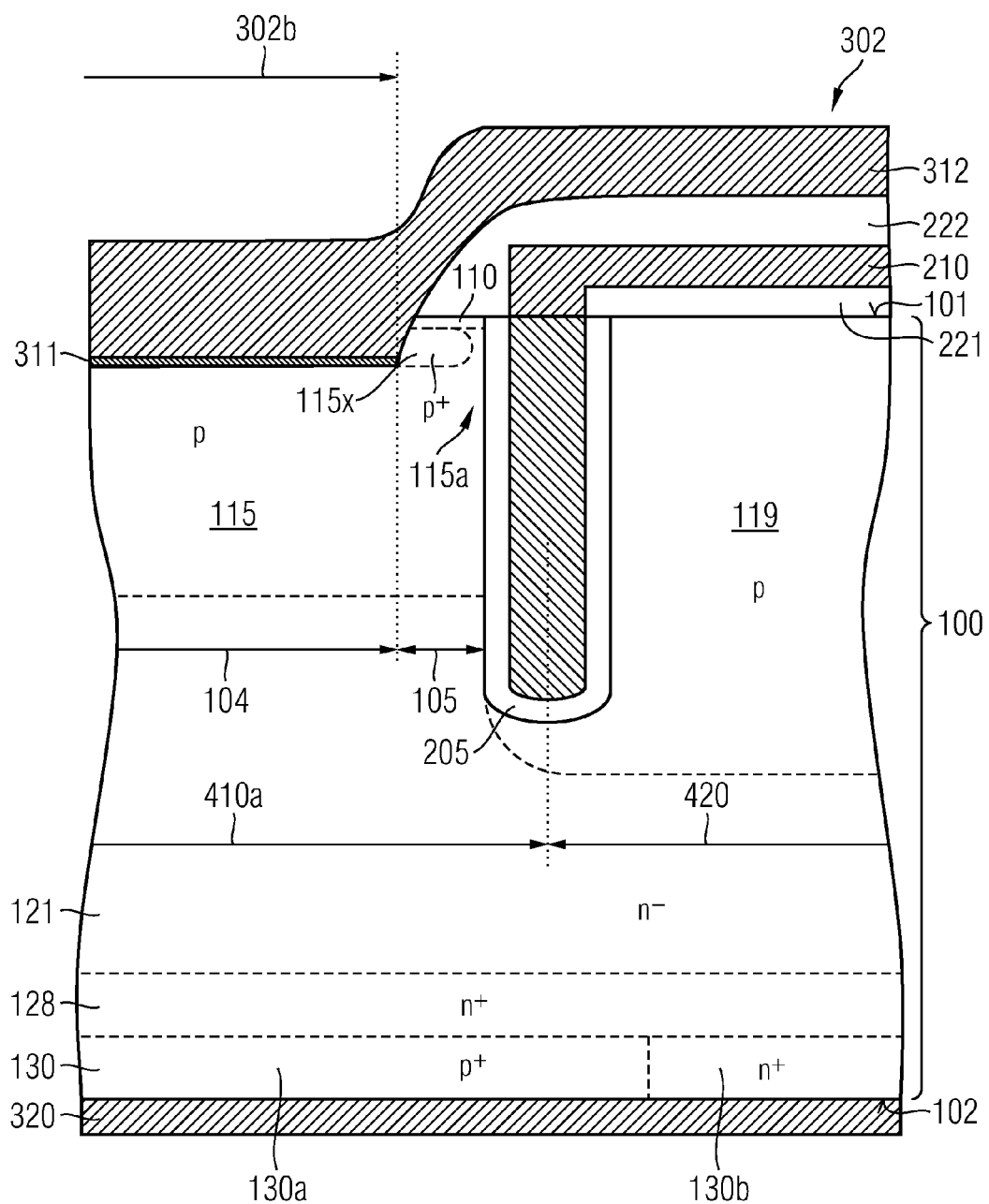

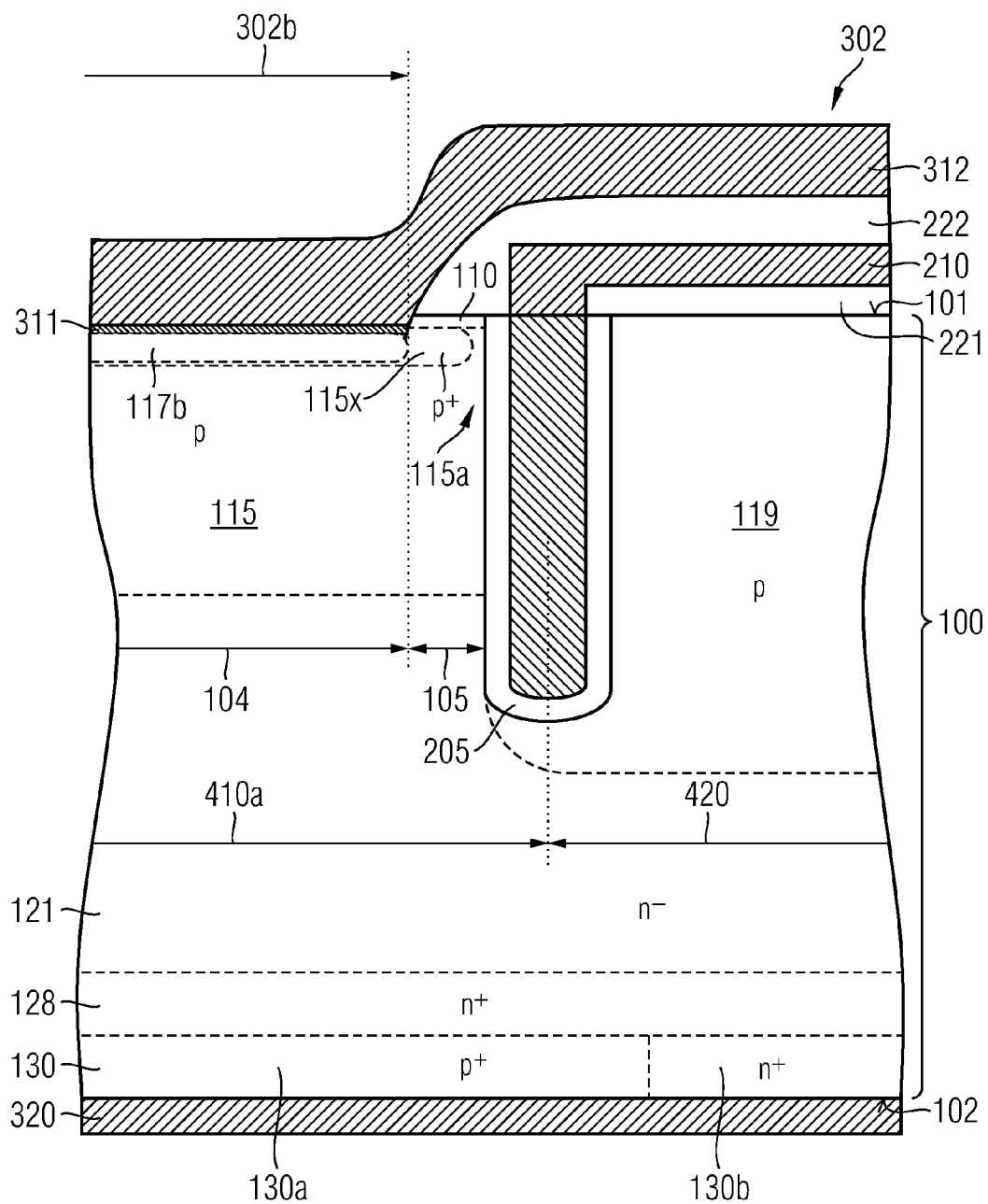

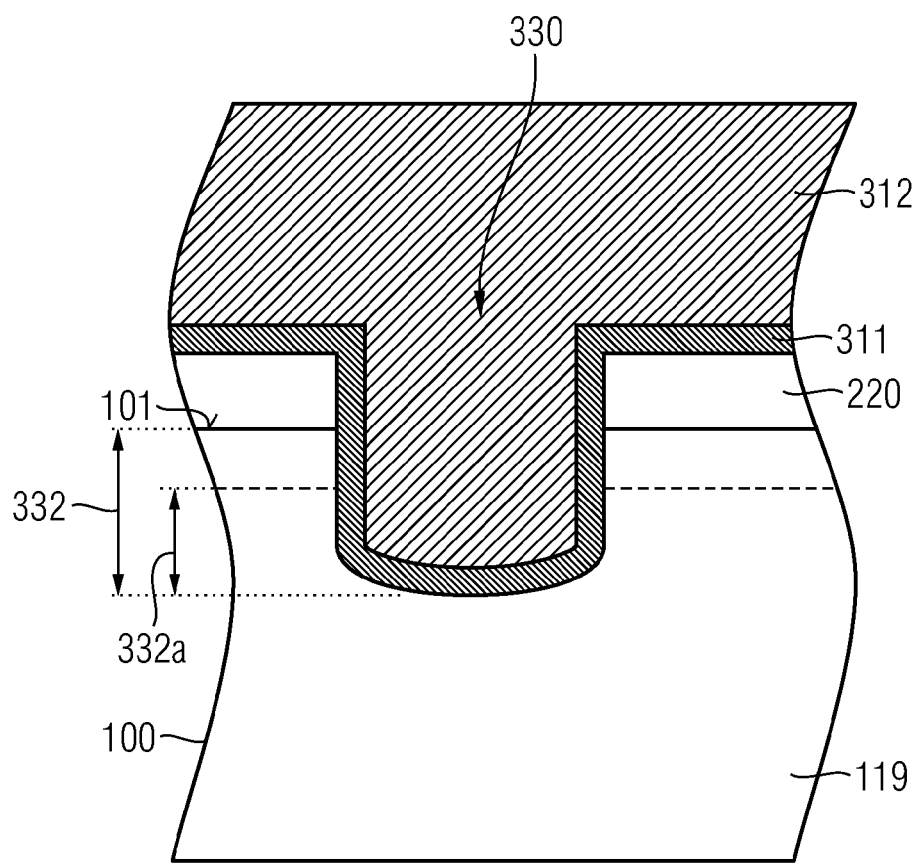

US 9,209,109 B2

IGBT WITH EMITTER ELECTRODE ELECTRICALLY CONNECTED WITH AN IMPURITY ZONE

BACKGROUND

RC-IGBTs (reverse conducting insulated gate bipolar transistors) monolithically integrate a freewheeling diode. When the RC-IGBT is forward biased, the RC-IGBT is effective as an electronic switch capable of switching on and off a current flowing in a first direction between a collector and an emitter terminal subject to a gate potential applied to a gate terminal. When the RC-IGBT is reverse-biased, the RC-IGBT conducts a current flowing in a second direction opposite to the first direction irrespective of the gate potential. In typical applications like motor drivers and switched mode power supplies the RC-IGBTs permanently changes between the reverse and forward biased states. It is therefore desirable to reduce switching losses in the RC-IGBT.

SUMMARY

According to an embodiment, an IGBT includes a semiconductor portion with IGBT cells. At least one of the IGBT cells includes a source zone of a first conductivity type, a body zone of a second, complementary conductivity type, and a drift zone of the first conductivity type separated from the source zone by the body zone. An emitter electrode includes a main layer and an interface layer. The interface layer directly adjoins at least one of the body zone and a supplementary zone of the second conductivity type. A contact resistance between the semiconductor portion and the interface layer is higher than between the semiconductor portion and a material of the main layer.

According to another embodiment a semiconductor device includes a semiconductor portion that includes an impurity zone. A contact structure includes a subsurface portion that extends from a first surface into the semiconductor portion and includes a contact section at a distance to the first surface. The impurity zone directly adjoins at least the contact section. The contact structure includes a main layer and an interface layer sandwiched between the main layer and the semiconductor portion. The interface layer contains at least one of titanium Ti and tungsten W as main constituents.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

FIG. 5B is a schematic cross-sectional view of a portion of a trench-type RC-IGBT in accordance with an embodiment providing a deep contact trench and a patterned interface layer.

FIG. 5C is a schematic cross-sectional view of a portion of a trench-type RC-IGBT in accordance with an embodiment providing a counter implant and a patterned interface layer.

FIG. 6 is a schematic cross-sectional view of a portion of a semiconductor device in accordance with an embodiment providing contact structures with a subsurface portion and an interface layer.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example resistors, resistive elements or elements that are controllable to temporarily provide a low-ohmic connection in a first state and a high-ohmic electric decoupling in a second state.

The Figures illustrate relative doping concentrations by indicating "−" or "+" next to the doping type "n" or "p". For example, "n−" means a doping concentration that is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1A:
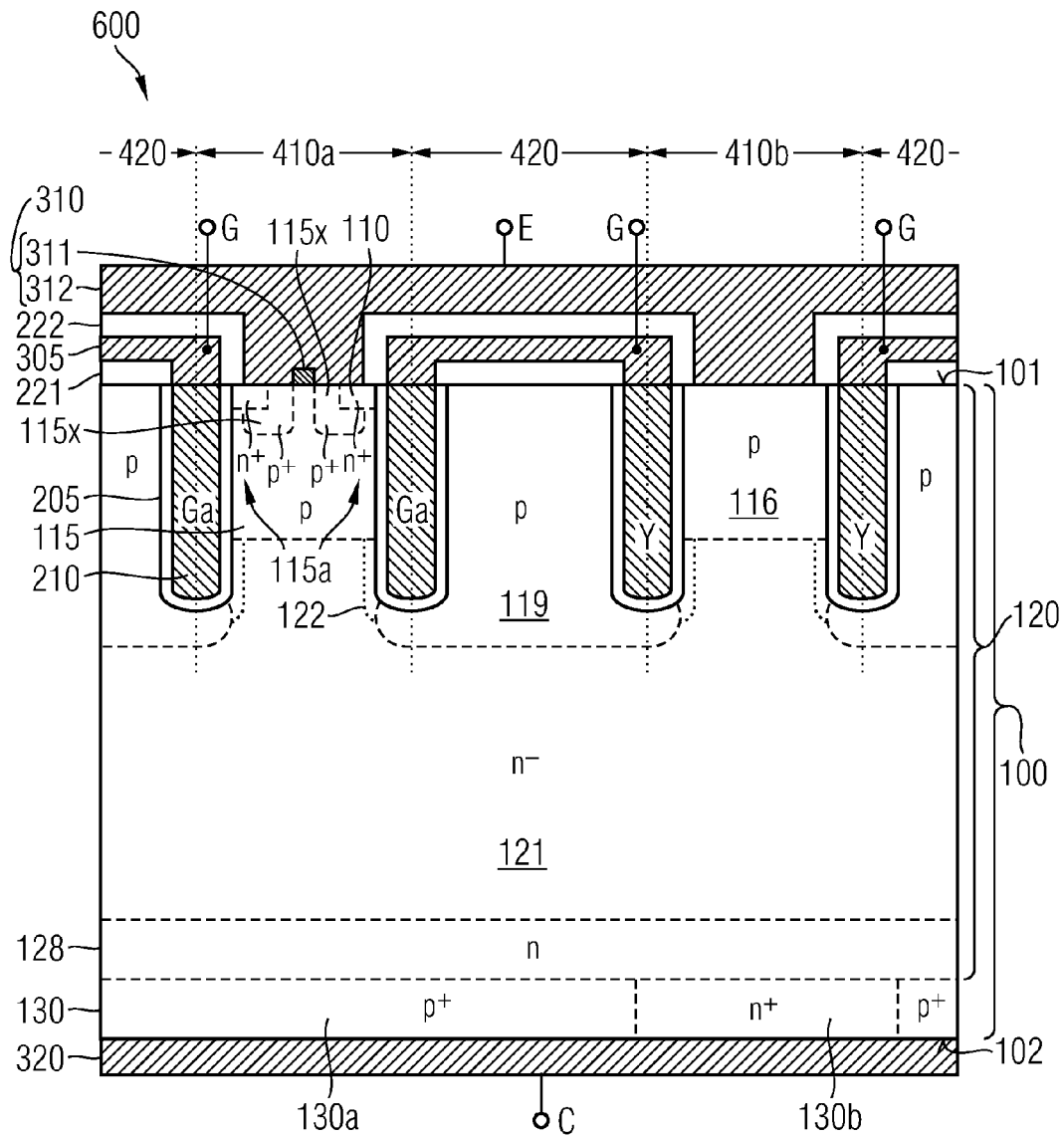
FIG. 1A is a schematic cross-sectional view of a portion of a trench-type RC-IGBT in accordance with an embodiment providing a patterned interface layer in contact with a body zone.

FIG. 1A shows an RC-IGBT 600 with a semiconductor portion 100 having a first surface 101 and a second surface 102 parallel to the first surface 101. The semiconductor portion 100 is provided from a single-crystalline semiconductor material, for example silicon Si, silicon carbide SiC, germanium Ge, a silicon germanium crystal SiGe, gallium nitride GaN or gallium arsenide GaAs. A distance between the first and second surfaces 101, 102 is selected to achieve a specified voltage blocking capability and may be at least 50 µm, for example at least 175 µm. Other embodiments may provide semiconductor portions 100 with a thickness of several 100 µm.

The semiconductor portion 100 may have a rectangular shape with an edge length in the range of several millimeters. The normal to the first and second surfaces 101, 102 defines a vertical direction and directions orthogonal to the normal direction are lateral directions.

In the semiconductor portion 100 a collector layer 130 directly adjoins the second surface 102. The collector layer 130 includes first portions 130a and second portions 130b, which may alternate in one lateral direction or in both lateral directions. The second portions 130b have a first conductivity type and the first portions 130a have a second, complementary conductivity type. Both the first and the second portions 130a, 130b are comparatively heavily doped. The mean net impurity concentrations may be at least $1 \times 10^{16}$ cm$^{-3}$, for example at least $5 \times 10^{17}$ cm$^{-3}$.

A collector electrode 320 directly adjoins the second surface 102 and is electrically connected to the collector layer 130. The collector electrode 320 may consist of or contain, as main constituent(s), aluminum Al, copper Cu or alloys of aluminum or copper, for example AlSi, AlCu, or AlSiCu. According to other embodiments, the collector electrode 320 may contain one, two, three or more sub-layers, each sub-layer containing, as a main constituent, at least one of nickel Ni, titanium Ti, silver Ag, gold Au, tungsten W, platinum Pt and palladium Pd. For example, a sub-layer may contain a metal nitride or a metal alloy containing Ni, Ti, Ag, Au, W, Pt, and/or Pd. The collector layer 130 may provide or may be electrically connected to a collector terminal C of the RC-IGBT 600.

In the semiconductor portion, a semiconducting layer 120 forms an interface with the collector layer 130, wherein the interface may be parallel to the first and second surfaces 101, 102. The semiconducting layer 120 may include a field stop layer 128 of the first conductivity type. The field stop layer 128 directly adjoins the collector layer 130. A mean net impurity concentration in the field stop layer 128 is lower than in the second portions 130b of the collector layer 130. For example, the mean net impurity concentration in the second portions 130b exceeds at least five times the mean net impurity concentration in the field stop layer 128. According to an embodiment, the mean net impurity concentration in the field stop layer 128 is between $5 \times 10^{15}$ cm$^{-3}$ and $1 \times 10^{17}$ cm$^{-3}$.

With the field stop layer 128, or, in absence of a field stop layer 128, with the collector layer 130 a low doped drift zone 121 of the first conductivity type forms an interface which is parallel to the first and second surfaces 101, 102. The mean net impurity concentration in the drift zone 121 is lower than in the field stop layer 128. According to an embodiment, the mean net impurity concentration in the field stop layer 128 exceeds at least five times the mean net impurity concentration in the drift zone 121. The mean net impurity concentration in the drift zone 121 may be between $5 \times 10^{12}$ cm$^{-3}$ and $5 \times 10^{14}$ cm$^{-3}$, by way of example.

Buried electrode structures 210 extend from the first surface 101 into the semiconductor portion 100. Dielectric liners 205 separate the buried electrode structures 210 from the semiconductor material of the semiconductor portion 100. The buried electrode structures 210 may be parallel stripes arranged in a regular pattern. According to other embodiments, the lateral cross-sectional areas of the buried electrode structures 210 may be circles, ellipsoids, ovals or rectangles, i.e. squares, with or without rounded corners, or rings. For example two or three buried electrode structures 210 may form an arrangement with two or three concentric rings, wherein the rings may be circles, ellipsoids, ovals, or rectangles, e.g. squares with rounded corners.

An IGBT cell 410a is formed in the semiconductor portion 100 between two neighboring buried electrode structures 210 or within a ring-shaped buried electrode structure 210. In each IGBT cell 410a a body zone 115 of the second conductivity type may extend between the two neighboring buried electrode structures 210 or within the ring-shaped buried electrode structure 210. The body zone 115 forms a pn junction with the drift zone 121. In each IGBT cell 410a at least one, e.g. two, source zones 110 of the first conductivity type may extend from the first surface 101 into the semiconductor portion 100.

The body zones 115 may include at least one, e.g. two, contact zones 115x of the second conductivity type. The contact zones 115x are formed between the source zones 110 and remaining portions of the body zones 115 outside the contact zones 115x and directly adjoin the source zones 110. A maximum net impurity concentration in the contact zones 115x is significantly higher than a maximum net impurity concentration in the remaining portions of the body zones 115 outside the contact zones 115x. For example, the maximum net impurity concentration in the contact zones 115x exceeds at least ten times the maximum net impurity concentration in the remaining portions of the body zones 115. The contact zones 115x may result from an implant process provided in addition to the formation of the body zones 115 and reduce the risk of latch-up effects.

Each source zone 110 forms a pn junction with the body zones 115 that may or may not include contact zones 115x. The source zones 110 directly adjoin the dielectric liner 205. The contact zones 115x may extend deeper into the semiconductor portion 100 than the source zones 110 and do not reach the dielectric liner 205.

The semiconductor portion 100 may include a plurality of approximately identical IGBT cells 410a arranged in regular patterns in one or more cell arrays. The IGBT cells 410a may be aligned with the first portions 130a of the collector layer 130. For example, the body zones 115 may be formed in a vertical projection of the first portions 130a.

Buried electrode structures 210 directly adjoining the IGBT cells 410a provide insulated gate electrodes Ga. A potential applied to the insulated gate electrodes Ga controls a minority charge carrier distribution in channel portions 115a of the body zones 115, wherein the channel portions 115a adjoin the insulated gate electrodes Ga between the source zones 110 and the drift zone 121. If in a forward biased mode the gate potential applied to the insulated gate electrodes Ga exceeds a predefined threshold voltage, inversion channels of the first conductivity type are formed in the body zones 115 along the insulated gate electrodes Ga and an on state current flows between the source zones 110 and the collector layer 130. Other buried electrode structures 201 provide auxiliary electrodes Y.

In addition to the IGBT cells 410a, the semiconductor portion 100 may include at least one diode cell 410b and/or at least one spacer region 420. Each spacer region 420 may separate two neighboring IGBT cells 410a, two neighboring diode cells 410b, or may be formed between an IGBT cell 410a and a diode cell 410b.

In each diode cell 410b an anode zone 116 of the second conductivity type is formed between two neighboring buried electrode structures 210 or within a ring-shaped buried electrode structure 210 between the first surface 101 and the drift zone 121. Each anode zone 116 forms a pn junction with the drift zone 121 and may be aligned with the second portions 130b of the collector layer 130. For example, the anode zones 116 may be formed in a vertical projection of the second portions 130b.

The anode zone 116 is one example of a supplementary zone of the second conductivity type, which are formed outside the IGBT cells 410a, have the same conductivity type as the body zone 115, and are electrically connected to the emitter electrode 320. Another example of a supplementary zone is a termination zone in an edge area surrounding a cell area that includes the IGBT and diode cells 410a, 410b. Parasitic impurity zones below gate electrode structures, e.g. gate pads or gate fingers, represent further embodiments of supplementary zones.

In each spacer region 420 a floating zone 119 of the second conductivity type may extend between neighboring buried electrode structures 210 or within a ring-shaped buried electrode structure 210 from the first surface 101 into the semiconductor portion 100. The floating zones 119 may extend deeper into the semiconductor portion 100 than the body and anode zones 115, 116. In accordance with an embodiment, the floating zones 119 extend deeper into the semiconductor portion 100 than the buried electrode structures 210 and the buried electrode structures 210 may extend deeper into the semiconductor portion 100 than the body zones 115 and the anode zones 116.

A wiring structure 305 may electrically connect neighboring buried electrode structures 210 with each other and with a gate terminal G. The wiring structure 305 may be provided from a highly conductive semiconductor material and/or may contain one or more metal layers provided from a metal or a metal compound, respectively. A first dielectric structure 221 dielectrically insulates the wiring structure 305 from the floating zones 119 in the semiconductor portion 100. A second dielectric structure 222 dielectrically insulates the wiring structure 305 from an emitter electrode 310.

The emitter electrode 310 extends through openings of the layer structure including the first and second dielectric structures 221, 222 and the wiring structure 305. In the openings the emitter electrode 310 is electrically connected with the source zones 110, the body zones 113, the contact zones 115x, and the anode zones 116, whereas the floating zones 119 are dielectrically insulated from the emitter electrode 310. The emitter electrode 310 may provide or may be electrically connected with an emitter terminal E of the RC-IGBT 600.

The emitter electrode 310 includes a main layer 312 and an interface layer 311 sandwiched between the main layer 312 and the semiconductor portion 100. The interface layer 311 directly adjoins at least one body zone 115 or one of the supplementary zones like the anode zone 116. According to an embodiment, the interface layer 311 directly adjoins a first plurality of body zones 115 and the main layer 312 directly adjoins a second, complementary plurality of body zones 115. According to another embodiment, the interface layer 311 directly adjoins a first plurality of supplementary zones including the anode zones 116 and the main layer 312 directly adjoins a second, complementary plurality of the supplementary zones. Another embodiment may provide that the interface layer 311 directly adjoins some or all of the body zones 115 and the main layer 312 directly adjoins all supplementary zones. According to a further embodiment the interface layer 311 directly adjoins some or all of the supplementary zones and the main layer 312 directly adjoins all body zones 115.

As regards embodiments providing contact zones 115x, for each of the above-described embodiments the interface layer 311 may directly adjoin the remaining portions of the body zones 115 outside the contact zones 115x and the main layer 312 may directly adjoin at least the contact zones 115x. According to an embodiment, the interface layer 311 may directly adjoin both the contact zones 115x and remaining portions of the body zones 115 outside the contact zones 115x. The main layer 312 may be separated from the contact zones 115x or from both the contact zones 115x and the remaining portions of the body zones 115. Another embodiment may provide that both the main layer 312 and the interface layer 311 directly adjoin different portions of the contact zones 115x with only the interface layer 311 directly adjoining the remaining portions of the body zones 115.

A contact resistance between the interface layer 311 and the section of the semiconductor portion 100 directly adjoining the interface layer 311 is higher than a contact resistance between the main layer and the same section of the semiconductor portion 100 would be. In other words, the interface layer 311 is provided from a contact material, wherein a contact resistance between the contact material and an impurity zone in the semiconductor portion is higher than a contact resistance between the material of the main layer 312 and the same impurity zone. The interface layer 311 reduces diode hole emitter efficiency.

For the following description of the effects of the embodiments, the RC-IGBT 600 is assumed to be an n-channel IGBT with the first conductivity type being the n-type and the second conductivity type being the p-type. Equivalent considerations apply to p-channel IGBTs.

The RC-IGBT 600 can be operated in a forward biased mode and in a reverse biased mode. In the forward biased mode, a forward voltage is applied between the collector terminal C and the emitter terminal E that reverse biases the pn junctions between the body zones 115 and the drift zone 121 and the pn junctions between the anode zones 116 and the drift zone 121.

The n-channel RC-IGBT 600 is forward biased when a positive voltage is applied between the collector and emitter terminals C, E. In the forward biased mode a gate potential applied to the gate terminal G controls whether the RC-IGBT 600 is switched on or off. A gate potential higher than a threshold voltage generates a conducting inversion channel in the channel portions 115a of the body zone 115 between the source zone 110 and the drift zone 121. Through the inversion channel the source zones 110 inject n-type charge carriers (electrons) into the drift zone 121. The first portions 130a of the collector layer 130 inject p-type charge carriers (holes) into the drift zone 121. The charge carriers injected into the drift zone 121 generate a charge carrier plasma providing a low on-state resistance.

When in the forward biased mode the gate potential is below the threshold voltage at which the inversion channel is formed, the RC-IGBT 600 is in the off state. The voltage applied between the emitter and collector terminals E, C causes a depletion region that is generated along the pn junctions between the drift zone 121 and the body zones 115 to extend deeper into the drift zone 121. The maximum voltage the RC-IGBT 600 is capable to sustain before an avalanche breakdown occurs defines the voltage blocking capability specified for the RC-IGBT 600.

In the reverse biased mode a negative voltage is applied between the collector and the emitter terminals C, E such that the pn junctions between the body and the drift zones 115, 121 and the pn junctions between the anode zones 116 and the n-doped drift zone 121 are forward biased. The pn junctions conduct a current irrespective of whether or not an inversion channel is formed in the body zones 115.

The p-type impurity zones electrically connected to the emitter electrode 310, i.e. the body zones 115, which may or may not include contact zones 115x, and the supplementary zones like the anode zones 116 inject p-type charge carriers (holes) into the drift zone 121 and the n-type second portions 130b of the collector layer 130 inject n-type charge carriers (electrons) into the drift zone 121. The injected charge carriers form a charge carrier plasma. When the RC-IGBT 600 switches from the reverse biased mode to the off state of the forward biased mode, the charge carrier plasma has to be removed from the drift zone 121 before the RC-IGBT 600 can block. Irrespective of the applied gate potential the RC-IGBT 600 may temporarily conduct a recovery current after having been switched into the forward biased mode. The recovery current removes the charge carrier plasma from the drift zone 121. The recovery current results in reverse recovery losses and contributes to the overall switching losses.

A positive desaturation pulse may be applied to the gate terminal G in the reverse biased state such that an n-type inversion channel is formed through the body zone 115 shortly before the RC-IGBT 600 is forward biased. In the inversion channel the electrons bypass the body zones 115 and less holes are injected from the body zones into the drift zone 121. The charge carrier plasma is partially released. After expiration of the desaturation pulse the potential at the gate electrode G is reduced such that the n-type inversion channel disappears. When shortly after the desaturation pulse the RC-IGBT changes from the reverse biased mode to the forward biased off-state, less charge carriers have to be dissipated from the drift zone 121 such that the RC-IGBT 600 is faster in the blocking state and reverse recovery losses are significantly reduced.

The interface layer 311 is made of a material having a higher contact resistance to an impurity zone in the semiconductor portion 100 than the main layer 312. With the comparatively high contact resistance between the emitter electrode 310 and the body zones 115 the diode hole emitter efficiency is significantly reduced and less holes are injected into the drift zone 121. Reverse recovery losses are significantly reduced without lowering the net impurity concentration in the body and contact zones 115, 115x such that the voltage blocking capabilities and device ruggedness concerning over current switching and over current commutation are not adversely affected. The approach may be combined with a desaturation pulse to further reduce the reverse recovery losses.

The interface layer 311 may be provided from any material having a higher contact resistance to the body zone 115 than the main layer 312. The main layer 312 may contain aluminum Al and/or copper Cu as the only main constituent or as one of at least two main constituents. The main layer 312 may contain silicon Si as additional main constituent. The interface layer 311 may contain titanium Ti and/or tantalum Ta as the only main constituent or as one of at least two main constituents. According to an embodiment, the interface layer 311 contains titanium nitride TiN, tantalum nitride TaN, titanium Ti, and/or tantalum Ta.

According to a further embodiment, the interface layer 311 is provided from a material having a higher contact resistance to a low-doped semiconductor material, e.g. low doped single-crystalline silicon, than to a heavily doped semiconductor material, e.g. heavily doped single-crystalline silicon. For example, the interface layer 311 contains titanium and tungsten TiW. According to an embodiment the interface layer 311 contains more tungsten than titanium. The interface layer 311 may contain 5 to 40 atomic percent titanium and 60 to 95 atomic percent tungsten, for example 17 at % Ti and 83 at % tungsten.

According to an embodiment, the interface layer 311 is combined with an approach providing a high spread of the emitter efficiency between two selectable different reverse modes of the RC-IGBT 600. The spread may be exploited by using different gate voltages in the reverse biased mode.

At a first off state gate voltage of 0 V, no inversion channel is formed. If a second off state gate voltage applied to the insulated gate electrodes Ga is negative enough, p-type inversion layers 122 (p-channels) are formed in the drift zone 121 along the dielectric liner 205. The p-channels 122 of the insulated gate electrodes Ga may connect the p-type body zones 115 with the p-type floating zones 119. In the latter case, the p-type floating zones 119 contribute to the diode hole emitter efficiency. As a consequence the RC-IGBT 600 exhibits values for the diode forward current $I_F$ and for the switching losses which are significantly different for the two different off-state gate voltages. Inter alia in half bridge circuits the device characteristics of the integrated freewheeling diode in the RC-IGBT 600 can be tailored to fulfill different requirements during operation.

The diode hole emitter efficiency depends on the total amount of p-type impurities in the p-doped zones connected to the emitter electrode 310 and the contact resistance between the emitter electrode 310 and the p-doped zones. Increasing the contact resistance in turn increases the relative difference in diode hole emitter efficiency between the first and second off-state gate voltages. The approach may be combined with other approaches reducing the diode hole emitter efficiency of the body zones 115 and, if applicable the contact zones 115x or increasing the number of p-type impurities contributing to the diode hole emitter efficiency only in the second state.

Figure 1B:
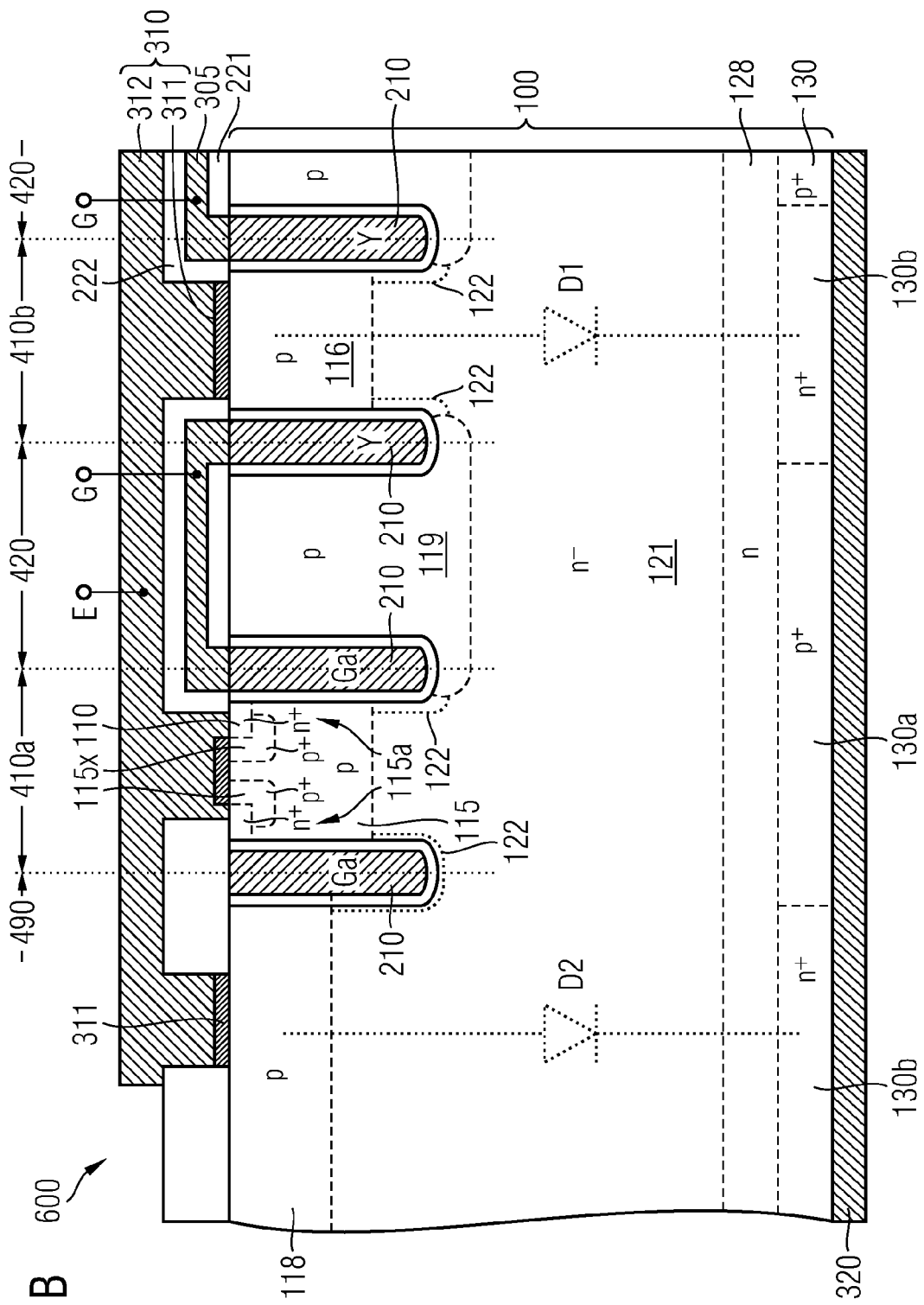
FIG. 1B is a schematic cross-sectional view of a portion of a trench-type RC-IGBT in accordance with an embodiment providing a patterned interface layer in contact with a body zone and supplementary zones.

The RC-IGBT 600 of FIG. 1B includes an edge area 490 surrounding a cell area with the IGBT cells 410a, diode cells 410b and spacer regions 420. In the cell area the anode zones 116 of the diode cells 410b forms a first pn junction D1 with the drift zone 121. The edge area 490 includes a termination zone 118 of the second conductivity type. The termination zone 118 directly adjoins the first surface 101 and forms a second pn junction D2 with the drift zone 121. The interface layer 311 of the emitter electrode 310 directly adjoins the body, contact, anode and termination zones 115, 115x, 116, 118 and reduces diode hole emitter efficiency both in the cell area and in the edge area 490. The main layer 312 may be deposited after patterning the interface layer 311 and may directly adjoin the source zones 110 or the source zones 110 and portions of the contact zones 115x.

Figure 2:
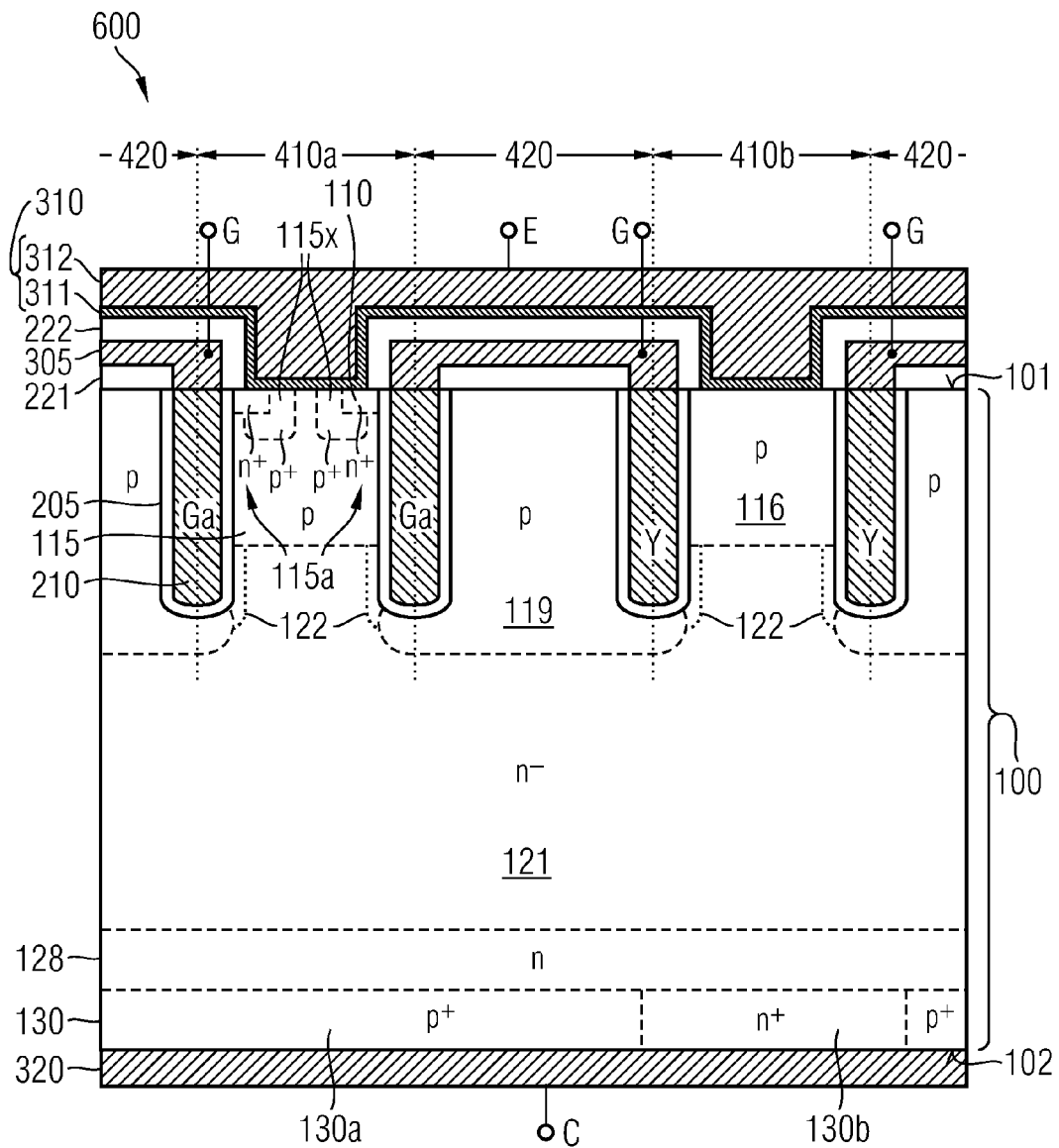
FIG. 2 is a schematic cross-sectional view of a portion of a trench-type RC-IGBT in accordance with an embodiment providing a continuous interface layer.

FIG. 2 shows a continuous interface layer 311. The main layer 312 may be deposited after deposition of the interface layer 311 and both layers 311, 312 may be patterned in a single patterning process.

The interface layer 311 may be provided from a contact material whose contact resistance to a semiconductor material increases with decreasing impurity concentration in a section of the semiconductor portion 100 that directly adjoins the interface layer 311. Diode hole emitter efficiency of the lower doped body zones 115 and other lower doped d-doped supplementary zones like the anode zones 116 may be decreased without adversely affecting the blocking behavior and the ruggedness of the IGBT cells 410a.

Figure 3:
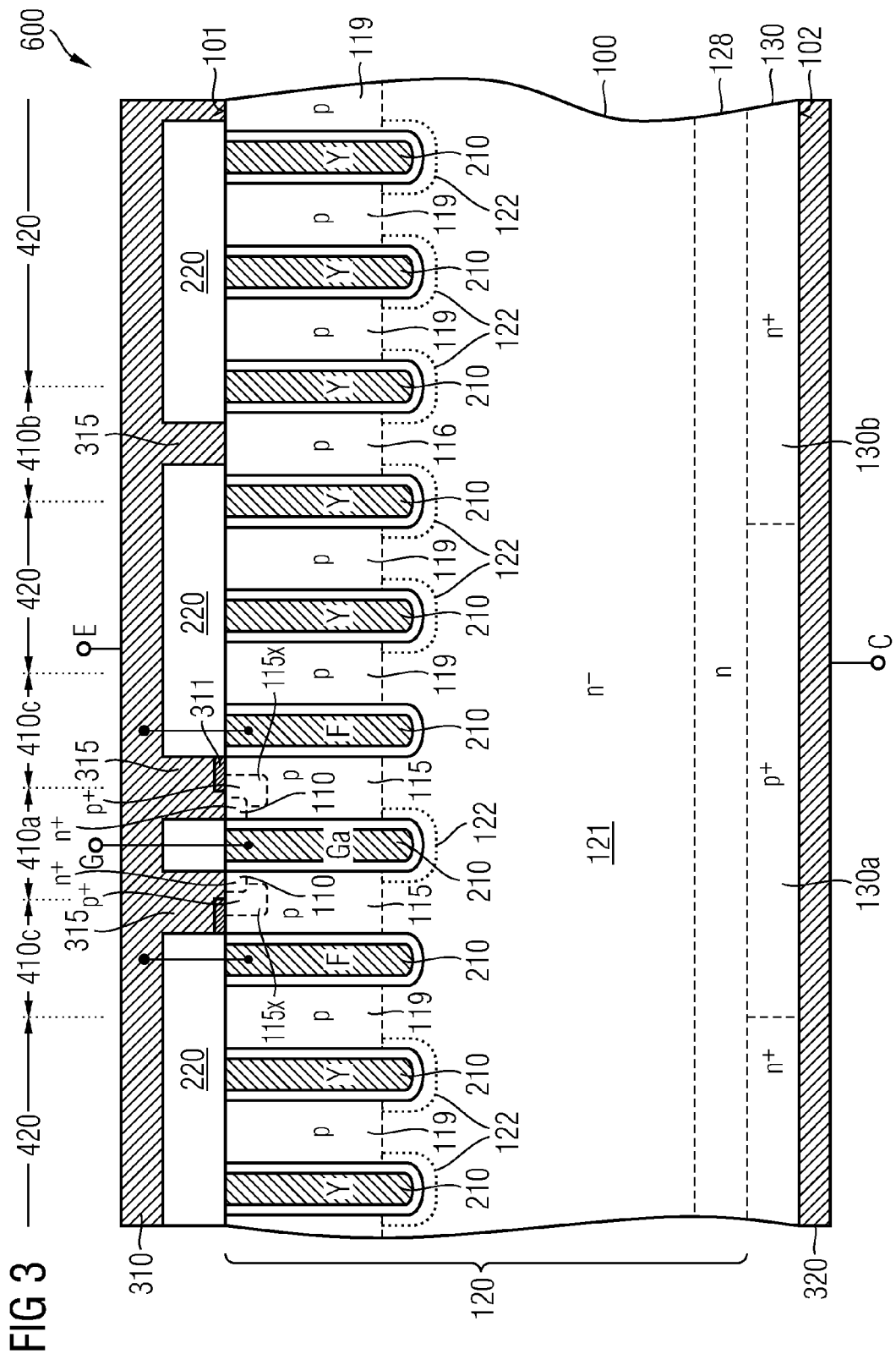
FIG. 3 is a schematic cross-sectional view of a trench-type RC-IGBT in accordance with an embodiment providing a layout with field electrodes.

FIG. 3 refers to an RC-IGBT 600 in a layout providing field regions 410c. The buried electrode structures 210 are arranged in a regular pattern of parallel stripes and extend into a drift zone 121 in the semiconductor portion 100. In the IGBT regions 410a, the p-type body zones 115 are formed between neighboring buried electrode structures 210. In the diode regions 410b anode zones 116 extend between neighboring buried electrode structures 210 from the first surface 101 into the semiconductor portion 100. In the spacer regions 420 p-type floating zones 119 extend between neighboring buried electrode structures 210 from the first surface 101 into the semiconductor portion 100. The body zones 115, anode zones 116 and floating zones 119 may emerge from the same implant process.

The buried electrode structures 210 extend deeper into the semiconductor portion 100 than the body zones 115, the anode zones 116 and the floating zones 119. A dielectric structure 220 electrically insulates the floating zones 119 from the emitter electrode 310 that is electrically connected to the anode zones 116, the body zones 115, and, if applicable, the contact zones 115x. The number of buried electrode structures 210 in each spacer region 420 may be two, three, or more.

First buried electrode structures 210 in the IGBT regions 410a form insulated gate electrodes Ga assigned to the IGBT cells 410a. Second buried electrode structures 210 in field regions 410c between the IGBT regions 410a and the spacer regions 420 are controlled independent of a voltage applied to the gate terminal G. According to an embodiment the buried electrode structures 210 in the field regions 410c do not form a p-channel in the drift zone 121 when p-channels 122 are formed in the drift zone 121 at the gate electrodes Ga. For example, the second buried electrode structures 210 are electrically connected with the emitter electrode 310 and form field electrodes F. Third buried electrode structures 210 spaced from the IGBT regions 410a may be electrically connected with the gate electrodes Ga and form auxiliary electrodes Y for controlling the p-channels in the drift zone 121.

When the first off state gate voltage is applied, p-channels 122 are formed along the insulated gate and auxiliary electrodes Ga, Y in the drift zone 121. The p-channels 122 connect the floating zones 119 to the anode zones 116 such that the floating zones 119 contribute to the diode emitter efficiency. If a voltage is applied at which no p-channel is formed in the drift zone 121 the floating zones 119 do not contribute to the diode hole emitter efficiency. As a result, the difference in diode emitter efficiency between the first and second off-state Gate voltages is high.

An interface layer 311 of the emitter electrode 310 may directly adjoin the body zones 115 which may include contact zones 115x spaced from channel portions 115a of the body zones 115 in which the inversion channels are formed. A main layer 312 directly adjoins the source zones 110 and may directly adjoin portions of the contact zones 115x. The interface layer 311 does not adversely affect the contact resistance to the source zones 110, which may be exclusively formed along the insulated gate electrodes Ga.

Figure 4A:
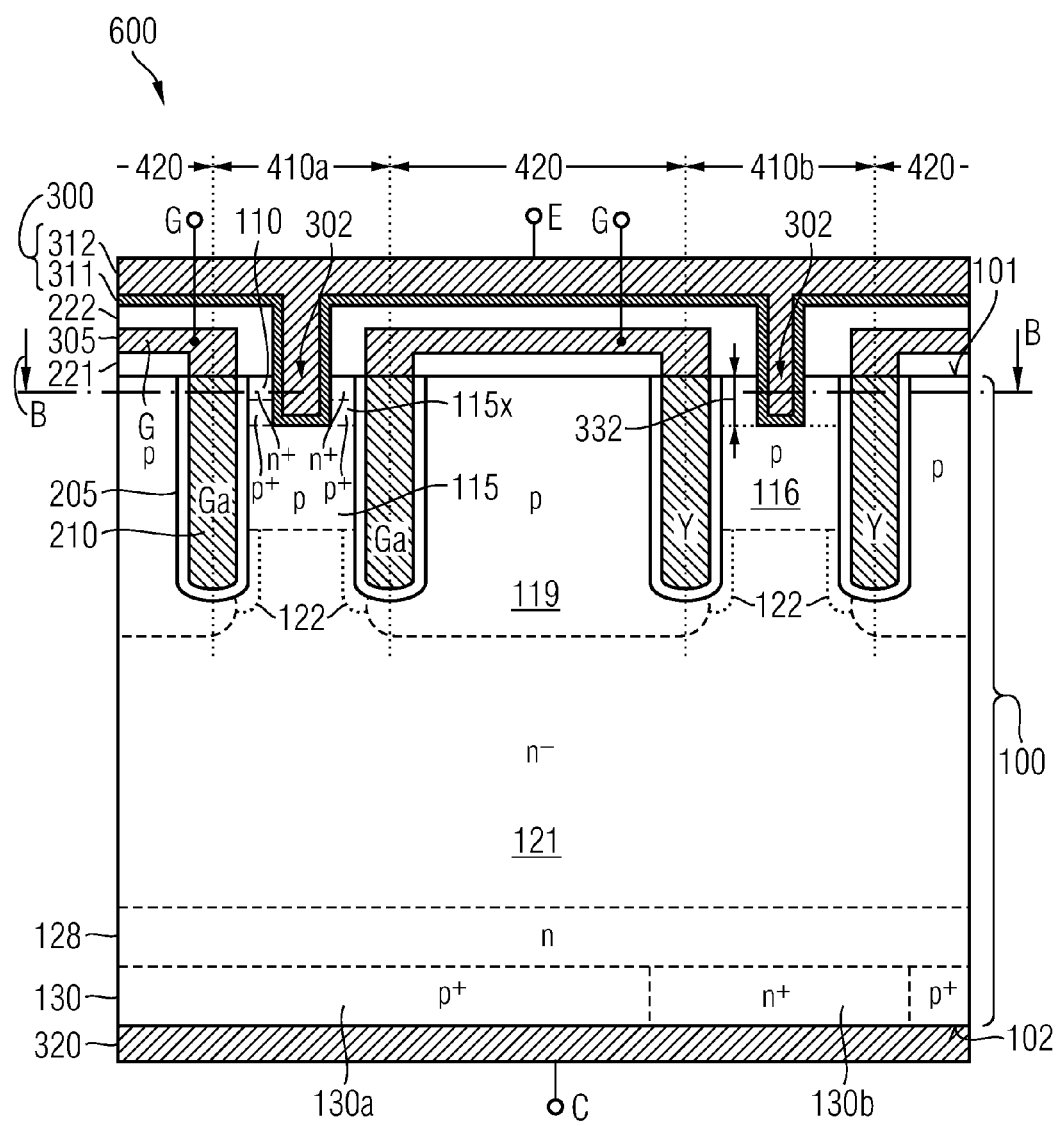
FIG. 4A is a schematic cross-sectional view of a portion of a trench-type RC-IGBT in accordance with an embodiment providing a continuous interface layer and contact trenches.

The embodiment of FIG. 4A differs from the embodiment of FIG. 2 in that trench contacts 302 extend from the first surface 101 into the semiconductor portion 100 in the IGBT cells 410a. In addition, trench contacts 302 may be provided in the diode cells 410b. According to the illustrated embodiment the trench contacts 302 reach the body zones 115 at a distance to the first surface 101 such that the source zones 110 and the contact zones 115x are formed in mesa portions between the insulated gate electrodes Ga and the trench contacts 302. The trench contacts 302 significantly reduce the total impurity amount in the body zones 115 with the contact zones 115x and in the anode zones 116. The diode hole emitter efficiency is significantly reduced and a spread of the diode hole emitter efficiency between two different gate voltages may be extended.

The source zones 110 of an IGBT cell 410a may directly adjoin a sidewall of the trench contact 302 that is tilted to the first surface 101. According to an embodiment, the trench contacts 302 have approximately vertical sidewalls. According to another embodiment, also the contact zones 115x of an IGBT cell 410a directly adjoin tilted sidewalls of the trench contacts 302.

A thickness of the interface layer 311 may be less than a half of a width of the trench contacts 302. For example, the interface layer 311 has a thickness of at least 25 nm. The interface layer 311 may be provided from a layer having at least one of titanium Ti and tantalum Ta as main constituent, for example TiN, TaN, Ta, or TiW or a combination thereof. The main layer 312 may be provided from Al with a copper content of approximately 0.5%. According to other embodiments, the main layer 312 may be a copper layer, an AlCu layer with additives or an AlCu alloy. The interface layer 311 is effective as a reliable diffusion barrier, for example against sodium Na. The main layer 312 may be provided without silicon as main constituent, resulting in improved deposition rates and layer conformity and in more reliable bond wire connections. A thin interface layer 311 suffices to compensate leakage issues in the main layer 312. The buried electrode structures 210 may be parallel stripes.

Figure 4B:
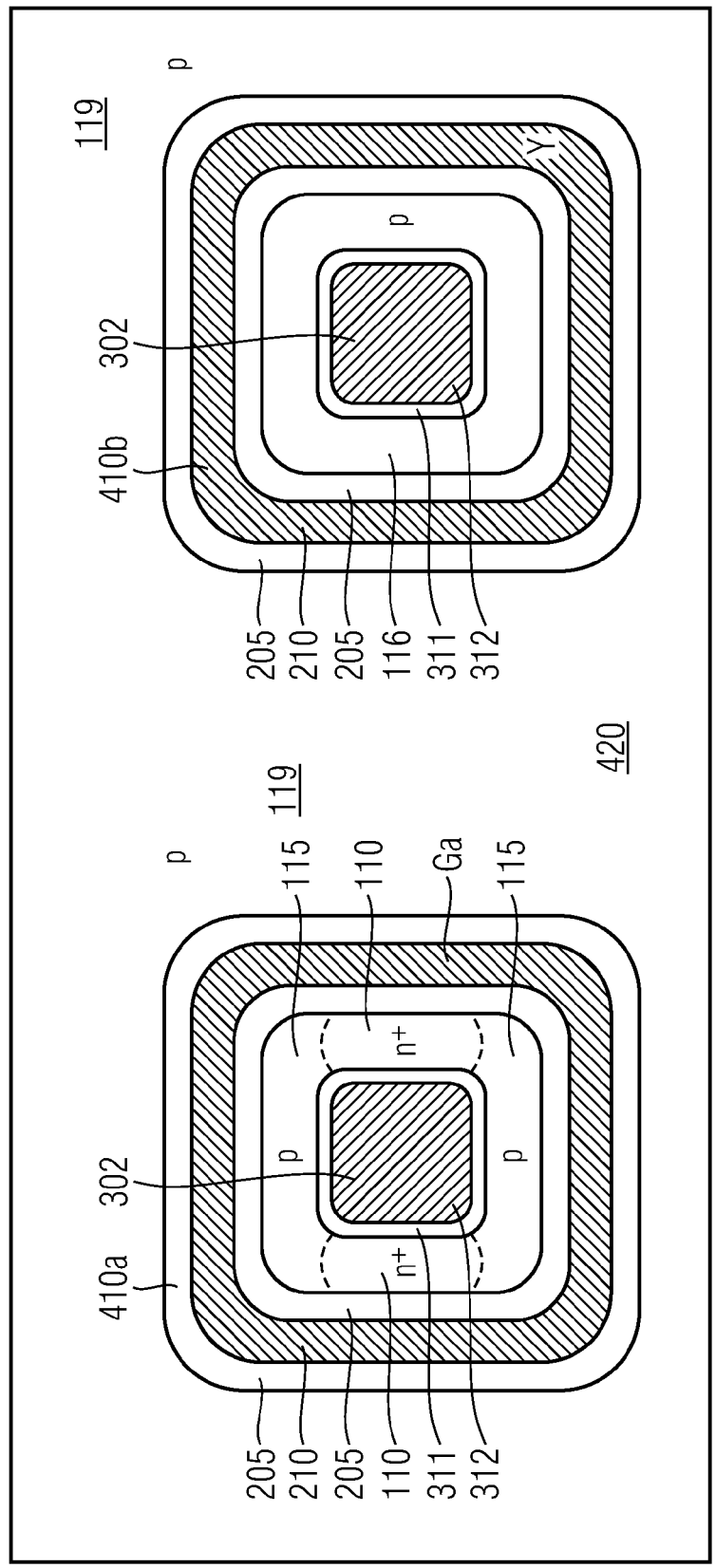
FIG. 4B is a schematic cross-sectional view of the portion of the RC-IGBT of FIG. 4A along line B-B.

FIG. 4B refers to an embodiment providing ring-shaped buried electrode structures 210 forming insulated gate electrodes Ga and auxiliary electrodes Y. The trench contacts 302 and the ring-shaped buried electrode structures 210 may be concentric. On the left-hand side, a first ring-shaped buried electrode structure 210 defines an IGBT region 410a. The source zone 110 may be ring-shaped and may surround the trench contact 302 on all sides. According to an embodiment, the source zone 110 is formed along only one of the edges of the respective trench contact 302. According to the illustrated embodiment, two spatially separated portions of the source zone 110 are formed at opposing sides of the trench contact 302. On the right-hand side, a second ring-shaped buried electrode structure 210 defines a diode region 410b. A spacer region 420 with a floating region 119 embeds the IGBT and diode regions 410a, 410b.

Figure 5A:
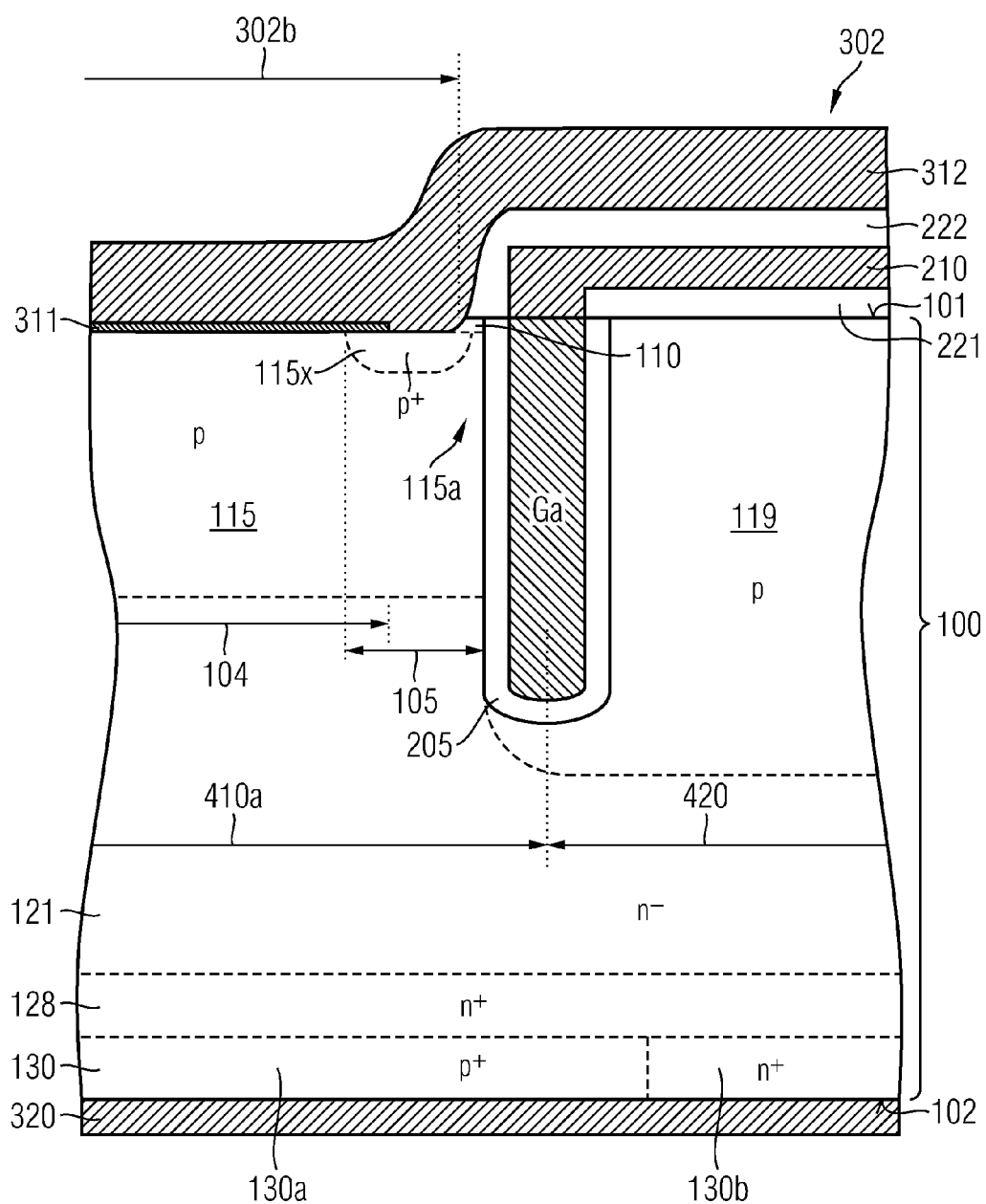
FIG. 5A is a schematic cross-sectional view of a portion of a trench-type RC-IGBT in accordance with an embodiment providing a shallow contact trench and a patterned interface layer.

FIG. 5A refers to a shallow trench contact 302b providing each source zone 110 in a mesa portion between the shallow trench contact 302b and the adjoining insulated gate electrode Ga. The contact zones 115x are provided in an outer portion 105 of the IGBT cell 410a adjoining the insulated gate electrode Ga and at a distance to the insulated gate electrode Ga. The interface layer 311 provided in an inner portion 104 is mainly or exclusively formed between the main layer 312 and the body zone 115 and is mainly or completely absent between the main layer 312 and the source zone 110. The inner and outer portions 104, 105 may overlap or may be spaced or may directly adjoin each other.

According to the embodiment of FIG. 5B both the source zones 110 and the contact zones 115x are provided in mesa portions between the contact trench 302b and the insulated gate structure Ga.

According to the embodiment of FIG. 5C the contact zones 115x emerge from an implant effective for the whole area of the trench contact 302b. In an inner portion 104 a counter implant zone 117b is formed by introducing impurities of the first conductivity type for locally reducing the net impurity concentration of impurities of the second conductivity type such that the heavily doped contact zones 115x are formed mainly or exclusively in an outer portion 105. The implanted impurities may be annealed or may be left unannealed to adjust the contact resistance.

FIG. 6 shows a semiconductor portion 100 that includes an impurity zone 119 and a contact structure 330. The contact structure 330 extends through a dielectric structure 230. A subsurface portion 332 of the contact structure 330 extends from a first surface 101 into the semiconductor portion 100. The impurity zone 119 directly adjoins at least a contact section 332a of the subsurface portion 332 at a distance to the first surface 101. The contact structure 330 includes a main layer 312 and an interface layer 311 sandwiched between the main layer 312 and the semiconductor portion 100. The interface layer 311 is deposited in PVD or CVD deposition technology, contains at least one of titanium Ti and tungsten W as main constituents and forms a sealed diffusion barrier against inter alia sodium Na. The interface layer 311 has a grain size of less than 20 nm or an amorphous structure. A thickness of the interface layer 311 may be less than a half of a width of the contact structure 330. A minimum thickness of the interface layer 311 at the bottom or at the sidewalls is at least 25 nm.

The contact structure 330 may be applied for power semiconductor elements such as IGBTs, e.g. RC-IGTBa, RB-IGBTs (reverse-blocking IGBTs), and IGFETs (insulated gate field effect transistors) including MOSFETs (metal oxide semiconductor field effect transistors) in the usual meaning including FETs with and without metal gate electrodes. The vertical extension of the subsurface portion 332 of the contact structure 330 in the semiconductor portion 100 may be greater than a distance between the contact structure 330 and a neighboring insulated electrode structure.

The thickness of the interface layer 311 at the sidewalls tilted to the first surface 101 may be at least 60% of the layer thickness at the bottom of the contact structure 330 in a distance to the first surface 101. The sidewalls of the subsurface portion 332 of the contact structure 330 may be vertical to the first surface 101 or may taper either with increasing or with decreasing distance to the first surface 101. The main layer 312 may contain at least aluminum. According to another embodiment, the main layer 312 may contain at least copper Cu.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein, e.g. planar IGBT cells with the gate electrode structure formed on the first surface. Therefore, it is intended that this invention be limited only by the claims and the equivalents thereof.

What is claimed is:

1. An IGBT comprising:
   a semiconductor portion that comprises IGBT cells, at least one of the IGBT cells comprising a source zone of a first conductivity type, a body zone of a second, complementary conductivity type, a drift zone of the first conductivity type separated from the source zone by the body zone; and
   an emitter electrode comprising a main layer and an interface layer that directly adjoins at least one of the body zone and a supplementary zone of the second conductivity type, wherein a contact resistance between the semiconductor portion and the interface layer is higher than between the semiconductor portion and a material forming the main layer.

2. The IGBT according to claim 1, further comprising an insulated gate electrode extending from a first surface into the semiconductor portion.

3. The IGBT according to claim 1, wherein the interface layer directly adjoins the source zone.

4. The IGBT of claim 1, wherein the contact resistance between the interface layer and the semiconductor portion increases with decreasing impurity concentration in the semiconductor portion.

5. The IGBT of claim 1, wherein the interface layer is provided from a contact material selected from a group consisting of TiW, TiN, TaN, and Ta.

6. The IGBT of claim 1, wherein the interface layer is provided from a layer containing at least one of titanium and tungsten as main constituents.

7. The IGBT of claim 1, wherein the supplementary zone is a termination zone in an edge area surrounding a cell area including the IGBT cells.

8. The IGBT of claim 1, wherein the IGBT cells comprise first IGBT cells with body zones directly adjoining the interface layer, and second IGBT cells with body zones directly adjoining the main layer.

9. The IGBT of claim 1, wherein
   the body zone comprises a contact zone, respectively, the contact zones having a mean net impurity concentration at least ten times a mean net impurity concentration in portions of the body zones outside the contact zones, and
   the IGBT cells comprise first IGBT cells with the contact zones directly adjoining the interface layer and second IGBT cells with the contact zones directly adjoining the main layer.

10. The IGBT of claim 1, wherein the supplementary zone is an anode zone of a diode cell, the anode zone forming a pn junction with the drift zone.

11. The IGBT of claim 1, comprising:
    first diode cells with anode zones directly adjoining the interface layer, and
    second diode cells with anode zones directly adjoining the main layer.

12. The IGBT of claim 1, comprising a counter implant zone in the body zone, the contact implant zone directly adjoining the interface layer.

13. The IGBT of claim 1, wherein a minimum thickness of the interface layer is at least 25 nm.

14. The IGBT of claim 1, wherein a net impurity concentration in a portion of the body zone directly adjoining the interface layer is at most $1 \times 10^{17}$ cm$^{-3}$.

15. The IGBT according to claim 1, wherein the IGBT is adapted to form a first inversion layer in the body zone at an on-state gate voltage, a second inversion layer in the drift zone at a first off-state gate voltage and none of the inversion layers at a second off-state gate voltage differing from the on-state and first off-state voltages.

16. The IGBT according to claim 15, wherein the semiconductor portion comprises a floating zone of the second conductivity type and the second inversion layer connects the floating zone and the body zone.

17. The IGBT according to claim 1, wherein
the body zone comprises a contact zone having a mean net impurity concentration at least ten times a mean net impurity concentration in portions of the body zone outside the contact zone, and
the interface layer directly adjoins the contact zone.

18. The IGBT according to claim 17, wherein the interface layer directly adjoins the contact and source zones.

19. The IGBT of claim 1, wherein a subsurface portion of a contact structure extends from the first surface into the body zone.

20. The IGBT of claim 19, wherein the source zone directly adjoins a sidewall of the subsurface portion of the contact structure tilted to the first surface.

21. The IGBT of claim 19, wherein the contact zone directly adjoins a sidewall of the subsurface portion of the contact structure tilted to the first surface.

22. The IGBT of claim 19, wherein a thickness of the interface layer is less than a half of a width of the subsurface portion of the contact structure.

23. A semiconductor device comprising:
a semiconductor portion that comprises an impurity zone, and
a contact structure comprising a subsurface portion extending from a first surface into the semiconductor portion and comprising a contact section at a distance to the first surface, wherein
the impurity zone directly adjoins at least the contact section and wherein the contact structure comprises a main layer and an interface layer sandwiched between the main layer and the semiconductor portion, the interface layer containing 5 to 40 atomic percent Ti and 60 to 95 atomic percent W as main constituents, wherein the interface layer has a grain size of less than 20 nm or an amorphous structure.

* * * * *